Jan. 29, 1952

K. ENSLEIN 2,584,004

METHOD AND APPARATUS FOR AUTOMATICALLY ALIGNING ELECTRICAL CIRCUITS

Filed April 20, 1950

4 Sheets-Sheet 1

INVENTOR.
Kurt Enslein
BY T. L. Bowes
Att'y

Fig. 5 Pulse Shaping Circuit
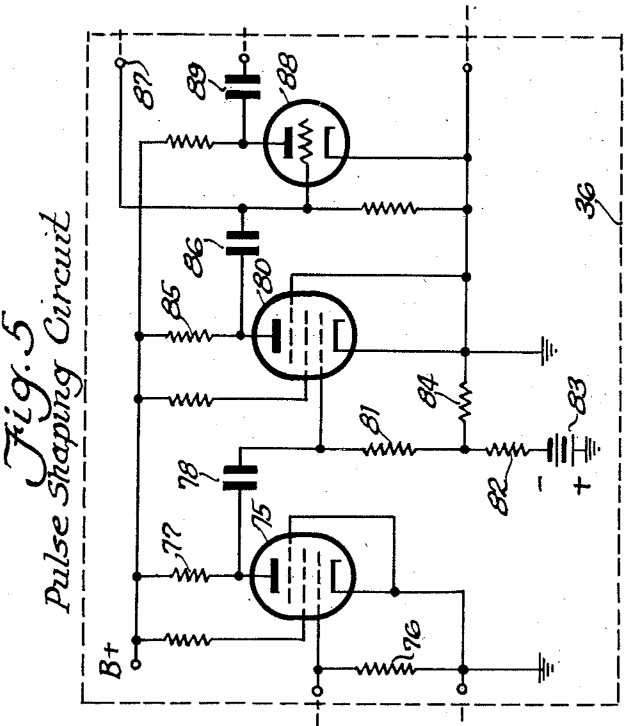
Fig. 4 Discriminating Amplifier
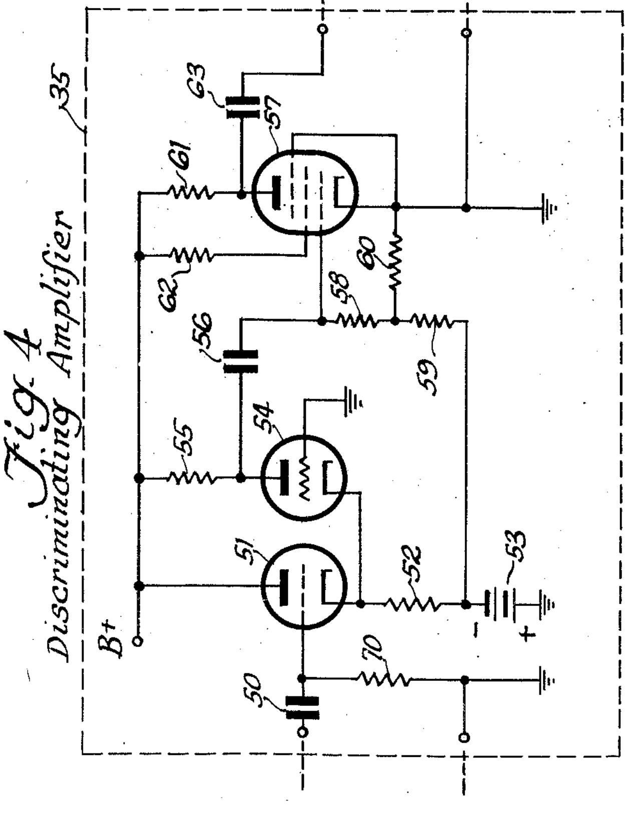
Fig. 7
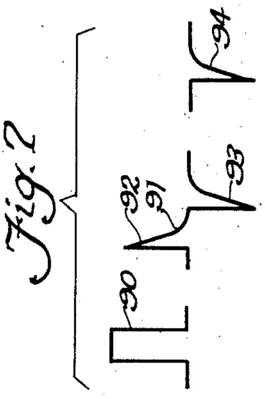
Fig. 6
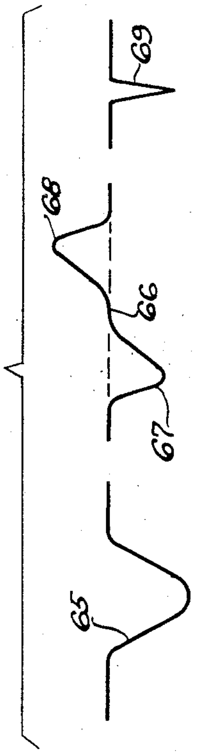
INVENTOR.
Kurt Enslein
BY J. L. Bowes
Att'y

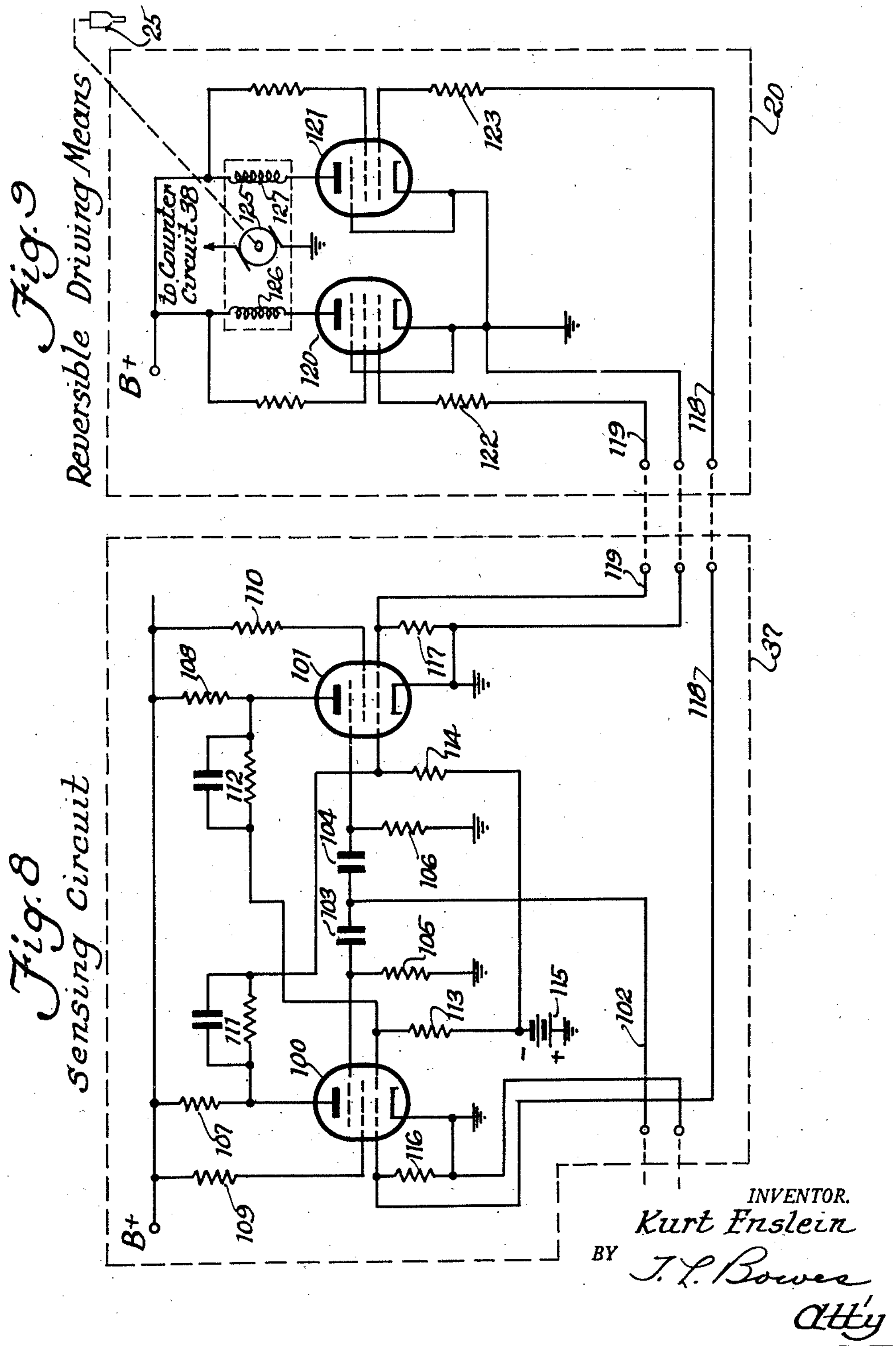
Fig. 9 Reversible Driving Means, Fig. 8 Sensing Circuit
INVENTOR.
Kurt Enslein
BY J. L. Bowes
Att'y INVENTOR.
Kurt Enslein
BY J. L. Bowes
Att'y Patented Jan. 29, 1952

2,584,004

UNITED STATES PATENT OFFICE 2,584,004

METHOD AND APPARATUS FOR AUTOMATICALLY ALIGNING ELECTRICAL CIRCUITS

Kurt Enslein, Rochester, N. Y., assignor to Stromberg-Carlson Company, a corporation of New York Application April 20, 1950, Serial No. 157,160

19 Claims. (Cl. 250—40)

The present invention relates to methods of and apparatus for adjusting electrical circuits, and, more particularly, to a method and apparatus for automatically aligning resonant circuits to a predetermined frequency. While my invention is of general utility, it is particularly suitable for use in the mass production of radio and television receivers, especially in connection with the alignment of the resonant circuits thereof.

In many instances, it is desirable to perform alignment operations upon electrical circuits by means of automatic apparatus which may be operated by untrained or semi-skilled operators. For example, in the mass production of radio and television receivers, the resonant circuits of the receiver must be tuned to the correct operating frequencies. Conventionally, the alignment of such resonant circuits is performed by trained operators, each operator being provided with expensive signal generators which sweep through the desired band of frequencies, the operator viewing the response curve produced thereby on an oscilloscope and manually adjusting the tuning of each resonant circuit to the correct frequency as seen on the oscilloscope. Such procedure in aligning the receiver is inherently laborious and time consuming and requires skilled personnel to manipulate and interpret the data obtained from the test equipment. Additionally, a separate testing station with its associated sweep generators, cathode ray oscilloscopes and other equipment must be provided for each assembly line, inasmuch as each operator requires a separate test signal which may be tuned through the desired band of operating frequencies.

It is, accordingly, an important object of the present invention to provide a new and improved method of and apparatus for automatically aligning electrical circuits to a predetermined frequency.

It is another object of the present invention to provide a new and improved method of and apparatus for automatically aligning electrical circuits to a predetermined frequency which method and apparatus are particularly suitable for use by unskilled operators on a production line basis.

It is a further object of the present invention to provide a new and improved method and apparatus for automatically aligning electrical circuits to a predetermined frequency without the use of sweep frequency generators or other complicated alignment equipment.

It is a still further object of the present invention to provide a new and improved method and apparatus for automatically aligning electrical circuits to a predetermined frequency wherein fixed frequency sources may be utilized for an entire mass production receiver assembly plant.

Figure 1:
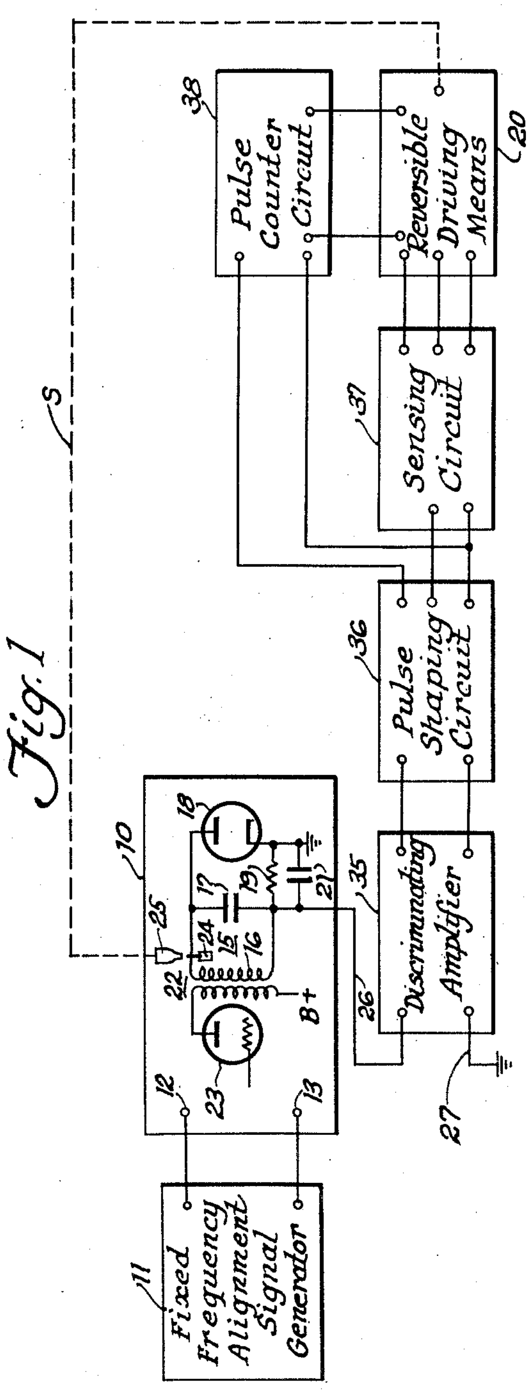

The invention, both as to its organization and method of operation, together with further objects and advantages thereof, will best be understood by reference to the following specification taken in connection with the accompanying drawings in which:

Fig. 1 is a schematic diagram in block form of an automatic alignment apparatus constructed in accordance with principles of the present invention;

Figs. 2, 3, 6 and 7 are diagrams showing wave forms which occur in certain portions of the apparatus of Fig. 1; and Figs. 4, 5 and 8 through 10 are detailed schematic diagrams of portions of the automatic alignment apparatus of Fig. 1.

Referring now to the drawings, there is illustrated in Fig. 1 in block diagram form, an automatic alignment apparatus suitable for practicing the method of the present invention. The modulated carrier wave receiver, the resonant circuits of which are to be aligned to the proper operating frequency, is illustrated generally at 10 and a fixed frequency alignment signal generator 11 is connected to the terminals 12 and 13 of the receiver 10. The receiver 10 may include a plurality of resonant circuits which are to be aligned to the correct operating frequency, one of these circuits being illustrated at 15. For example, the resonant circuit 15 may be contained in the intermediate frequency channel of the modulated carrier wave receiver under test. As shown, the resonant circuit 15 comprises an inductive branch 16 and a capacitive branch 17 and the resonant circuit 15 is associated with the second detector 18 of the receiver. As is customary, the second detector circuit includes a load resistor 19 and an associated filter capacitor 21 which are connected in series with the detector 18 and resonant circuit 15 and operate as a load circuit across which appears the detected voltage.

While the resonant circuit 15 may be energized by any suitable means from the preceding stage in the receiver, in the illustrated embodiment the inductance 16 is shown as the secondary winding of an interstage transformer 22, the primary of transformer 22 being connected to the anode of the preceding amplifying device 23. In this connection it will be understood that the device 23 is supplied with a signal at the fixed frequency of the alignment signal generator 11 through the intermediate stages of the receiver between the input terminals 12 and 13 and the device 23. Alternatively, the alignment signal from the signal generator 11 may be directly connected to the input circuit of device 23 in the event that the preceding stages are mistuned by an amount sufficient substantially to prevent transmission of the alignment signal through the intermediate stages, as will be readily apparent to those skilled in the art.

The resonant frequency of the circuit 15 may be varied by any suitable means. For example, the inductive branch 16 of the resonant circuit may be varied by means of a powdered iron tuning slug 24 which threads into the coil 16 so as to change the inductance thereof and hence the resonant frequency of the circuit 15. In order to align the resonant circuit 15 to the frequency of the alignment signal by fully automatic means which may be utilized by semi-skilled or unskilled personnel, there is provided means for automatically threading the tuning slug 24 into and out of coil 16. More specifically, there is provided a driving member 25 which may comprise any suitable tool, such as a screw driver, or the like, which engages the screw driver slot in the tuning slug 24, and which is driven through a flexible drive shaft S from a reversible driving means 20, controlled in accordance with the principles of the present invention. The driving member 25 may be engaged with the tuning slug either manually by the operator or by means of automatic or semi-automatic positioning apparatus.

In order to provide a suitable signal for controlling the operation of the reversible driving means 20 there is derived from the second detector load circuit 19 and 21 a signal voltage which varies with the tuning of the resonant circuit 15. Thus, the output from the second detector 18 is connected through the conductor 26 to the input of a discriminating amplifier 35. The output of the discriminating amplifier 35 is connected to a pulse-shaping circuit 36 and the output of the pulse-shaping circuit 36 is connected through a sensing circuit 37 to the reversible driving means 20. The output of the pulse shaping circuit 36 is also connected through a pulse counter circuit 38 to the reversible driving means 20.

To align the circuit 15 to the correct operating frequency, the reversible driving means 20 moves the tuning slug in a predetermined direction until the tuning of the resonant circuit 15 is passed through the peak resonance point which occurs at the frequency of the alignment signal. A control pulse indicative of the passage of the tuning of the resonant circuit 15 through the maximum response point is then utilized to reverse the driving means 20 so as to bring the tuning slug back to the correct peak resonance position. In the event that the driving means 20 causes the tuning slug to be moved too far in the opposite directions, a further control pulse is derived to reverse the driving means again, the driving means 20 being reversed by successive control pulses a sufficient number of times to bring the tuning slug into the correct position. Inasmuch as the tuning slug is brought approximately to the correct position upon the second reversal of the driving means 20, the pulse counter circuit 38 is provided to limit the number of times the driving means is reversed and hence the time consumed in moving the tuning slug to the correct position.

Figure 2:
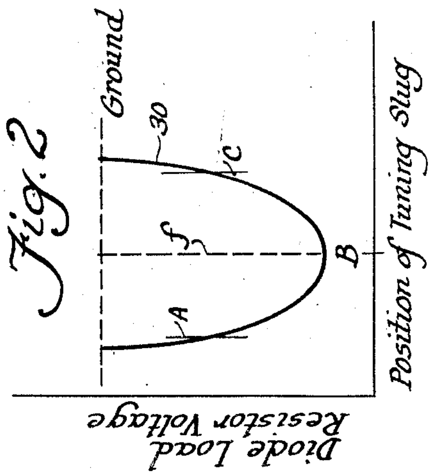

Considering now the operation of the above-described alignment apparatus as a whole, and without referring specifically to individual circuit arrangements suitable for providing the above discussed signals, as the tuning slug is moved in a particular direction by means of the driving member 25, the voltage across the detector load circuits 19 and 21 increases as the resonant frequency circuit 13 comes closer to the frequency of the alignment signal supplied to the circuit 16 between device 23. When the resonant frequency of the circuit 15 coincides with the alignment signal frequency the voltage developed across the detector load circuit is at a maximum value, and as the tuning slug moves further in the same direction the voltage decreases as the frequency of the circuit 15 moves further away from the peak resonance point. Thus, as illustrated in Fig. 2, the signal voltage from the detector load resistance may be plotted in terms of the position of the tuning slug and takes the form of a conventional single humped resonance curve 30, the maximum or peak resonance point B being coincident with the alignment signal frequency *f*. In this connection it will be understood that the second detector 18 is poled with respect to ground so as to produce a negative potential with respect to ground across the detector load circuit 19 and 21. Still referring to Fig. 2, it is evident that the slope of the resonance curve varies from a large negative value to a large positive value during the complete travel of the tuning slug in a particular direction. Thus, the slope of the resonance curve 30 with the tuning slug in an initial position A has a large negative value, the slope of the resonance curve at the peak resonance point B is equal to zero, and the slope of the resonance curve 30 at the end position C of the tuning slug has a large positive value. If, now, the tuning slug is moved from the initial position A to the final position C by the reversible driving means 20, a voltage proportional to the portion of the resonance curve between the positions A and C will be produced across the detector load circuits 26 and 27.

To provide a control signal which is indicative of the passage of the resonant circuit 15 through peak resonance, which signal may be used to reverse the driving means 20 after passage through the peak resonance point, the discriminating amplifier 35 is arranged to differentiate the voltage wave appearing across the detector load circuit. In this connection, it will be understood that differentiation of the control wave form produces a voltage which is equal to the rate of change, or, in other words, the differential, of the initial wave form 30. If the wave form appearing across the detector load circuit as the slug is moved in a predetermined direction is differentiated, there are provided positive and negative pulses which correspond to the changes in slope of the response curve 30. Thus, if the tuning slug is moved in the direction of the arrow 40, shown in Fig. 3(*a*), the wave form 41 is produced. The differential wave form 41 comprises a first negative peak 42 which corresponds to the large negative slope of the response curve at position A thereon and a positive peak 43 which corresponds to the large positive slope of the response curve 30 at position C. Intermediate the negative and positive pulses 42 and 43 the response curve 41 intersects the desired resonant frequency *f*, this intersection point corresponding to the position B shown in Fig. 2. It is thus evident that the positive pulse 43 of the differential wave form 41 is indicative of the passage of the resonant circuit through the peak resonance point, inasmuch as the initial portion of this positive pulse corresponds to the intersection of the wave form 41 with the desired resonant frequency *f*.

Figure 3A:
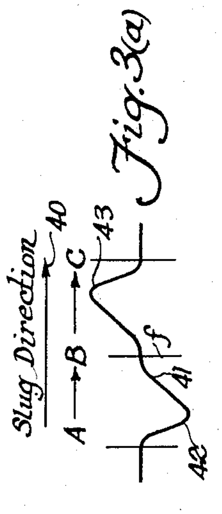
Figure 3B:
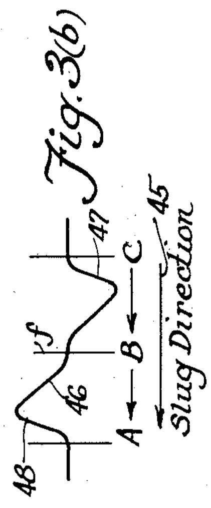

Considering now the differential wave form produced by the discriminating amplifier 35 when the tuning slug is moved in the opposite direction, illustrated by the arrow 45 in Fig. 3*b*, it is evident that the differential wave form 46 is reversed from the wave form 41 produced in Fig. 3*a*, and is provided with a negative pulse portion 47 followed by a positive pulse portion 48. However, the positive pulse portion again follows the intersection of the differential wave form 46 with the resonant frequency *f* so that the positive pulse portion may be utilized to reverse the direction of movement of the tuning slug regardless of the initial direction thereof.

The discriminating amplifier 35 not only differentiates the wave form appearing across the detector load circuit to provide the above-described differential wave form, but also selects the positive-going pulse portion of the differential wave form and rejects the negative pulse portion thereof. The amplifier 35 thus discriminates against the unwanted portion of the differential wave form. In order to reverse the driving means promptly after passage through the peak resonance point and to the end that the tuning slug may be brought to the correct position in a minimum of time and with a minimum number of reversals in the direction of movement thereof, there is provided the pulse shaping circuit 36 which acts upon the selected positive pulse portion of the differential wave form to provide a control pulse of negative polarity, the leading edge of which corresponds approximately to the crossover or intersection point of the differential wave form with the desired alignment frequency. The negative pulse from the pulse shaping circuit 36 is supplied to the sensing circuit 37 which operates as an electronic switch and reverses the driving means 20 for each control pulse supplied thereto.

Inasmuch as the tuning slug is brought to approximately the correct position upon the second reversal of the driving means 20, the total number of reversals of the driving means 20 may be limited so as to accomplish the desired alignment as quickly and efficiently as possible and with a minimum amount of time expended by the operator. To this end, there is provided the pulse counter circuit 38 to which are supplied pulses from the pulse shaping circuit 36. The pulse counter circuit 38 counts the number of pulses appearing at the output circuit of the pulse shaping circuit 36 which pulses correspond to reversals of the driving means 20, and deenergizes the driving means when a predetermined number of pulses have occurred.

In considering specific embodiments of the circuits indicated in block diagram form in Fig. 1, reference is now made to Fig. 4 wherein there is shown in detail a discriminating amplifier 35 suitable for providing the above-described control signal. As shown, the output from the detector load circuit is connected through a capacitor 50 to the control electrode of an electron discharge device 51. The control electrode of device 51 is connected through a resistor 70 to ground potential. The anode of device 51 is connected to a positive source of unidirectional potential indicated by the legend B+, the cathode of device 51 being connected through a resistor 52 to the negative terminal of a unidirectional source of potential indicated as the battery 53. The cathode of device 51 is also connected to the cathode of a second electron discharge device 54, the control electrode of device 54 being connected to ground. The anode of device 54 is connected through an anode load resistor 55 to the B+ supply and is further connected through a capacitor 56 to the control electrode of a pentode type electron discharge device 57. The control electrode of device 57 is connected through resistors 58 and 59 to the negative terminal of battery 53, the junction point of resistors 58 and 59 being connected through a further resistor 60 to ground potential. The anode of device 57 is connected through anode load resistor 61 to the B+ supply and there is provided a screen electrode dropping resistor 62 between the B+ supply and the screen electrode of device 57. The output from the anode of device 57 is connected through a capacitor 63 to the succeeding pulse shaping circuit 36.

In considering the operation of discriminating amplifier 35, reference may be had to Fig. 6 wherein there are illustrated wave forms which appear in certain portions of the amplifier 35. Thus, referring to Fig. 6, the wave form which is produced across the detector load circuit is illustrated by the wave form 65 and it is evident that the wave 65 is in the form of a single peaked resonance curve. The wave form 65 is supplied to the input circuit of the device 51 (Fig. 4) wherein it is differentiated to provide the differential wave form 66 illustrated in Fig. 6, the capacitor 50 and resistor 70 which comprise the input circuit of device 51 being of sufficiently small value to provide the necessary differentiating action. The device 51 is operated as a cathode follower and consequently the device 51 is able to follow the positive and negative portions of the differential wave form 66 without loading down the input circuit as will be readily apparent to those skilled in the art. The output of cathode follower 51 is directly connected to the device 54 which is operated as a grounded grid amplifier. Inasmuch as the phase of the input signal does not change in either of the devices 51 or 54, the differential wave form 66 is repeated in similar phase to the input circuit of the device 57. However, due to the biasing action of the control electrode network comprising resistors 58, 59 and 60, the control electrode of device 57 is operated at approximately the anode current cut-off point so that the negative pulse portion 67 of the differential wave form 66 (Fig. 6) is removed and a sharp negative pulse 69, which corresponds to the positive portion 68 of the differential wave form 66, appears in the output circuit of the discriminating amplifier 35.

While the selected negative pulse 69 is a rough indication of the slope reversal of the control wave 65, and hence a rough indication of the passage of the resonant circuit through the desired peak resonance point, it is necessary to square up the pulse 69 so as to provide a pulse, the leading edge of which will correspond almost exactly to the crossover point of the differential wave form 66. Such shaping action is provided by the pulse shaping circuit 36 which is illustrated in Fig. 5. Thus referring to Fig. 5, the negative pulse from the output of the discriminating amplifier 35 is supplied to the control electrode of a pentode type electron discharge device 75. The control electrode of device 75 is connected through a resistor 76 to ground and the anode of device 75 is connected through an anode load resistor 77 to the B+ supply potential. Voltage appearing at the anode of device 75 is coupled through capacitor 78 to the control electrode of a pentode type electron discharge device 80. The control electrode of device 80 is connected through resistors 81 and 82 to the negative terminal of the battery 83 and the junction point between resistors 81 and 82 is connected through a resistor 84 to ground potential. The anode of device 80 is connected through a resistor 85 to the B+ supply and voltage appearing at the anode of device 80 is coupled through capacitor 86 to the output terminal 87 and thence to the sensing circuit 37. The capacitor 86 is also connected to the control electrode of an electron discharge device 88 which inverts the pulse supplied thereto and supplies a pulse of opposite polarity from the anode circuit thereof through the capacitor 89 to the pulse counter circuit 38.

Considering now the operation of the above-described pulse shaping circuit, it is evident that the device 75 is operated at zero bias so that the negative-going pulse 69 drives the device 75 beyond anode current cutoff and hence the most negative portion of the pulse 69 is removed by grid clipping. The pulse 69 thus appears in the anode circuit of device 75 as a flat-topped positive-going pulse 90 (Fig. 7). The input circuit of device 80, which comprises capacitor 78 and resistor 81, is so chosen that the flat-topped pulse 90 is differentiated so as to provide at the control electrode of device 80 the wave form illustrated at 91 in Fig. 7. Thus, the differentiated wave form 91 comprises a positive pulse portion 92 which corresponds to the leading edge of the pulse 90, and a negative pulse portion 93 which corresponds to the trailing edge of the pulse 90. The control electrode of device 80 is operated at the anode current cutoff point, by means of the bias network including resistors 82 and 84, so that the negative-going pulse 93 of the differentiated wave form 91 is removed by grid clipping and there is provided in the anode circuit of device 80 a negative-going pulse 94 which coincides in time with the crossover point of the original differentiated control wave form 66 (Fig. 6). From the foregoing, it is evident that the discriminating amplifier and pulse shaping circuits described above differentiate and clip the initial response curve to provide a control pulse 69 which is indicative of the passage of the resonant circuit through the desired peak resonance point. The control pulse 69 is amplified and is differentiated so as to provide a second control pulse 94 which coincides in time almost exactly with the change in slope of the original resonance curve 65. The second control pulse 94 is then used to control the sensing circuit 37 and through the phase inverter 88 to control the pulse counter circuit 38.

In order to reverse the driving means 20 in response to successive control pulses from the pulse shaping circuit 36, there is provided the sensing circuit illustrated in Fig. 8. As shown, the sensing circuit 37 comprises a pair of electron discharge devices 100 and 101. The devices 100 and 101 are arranged to be switched abruptly from a conductive to a non-conductive state, or vice versa, in response to successive ones of the control pulses 94 supplied thereto from the pulse shaping circuit 36. The devices 100 and 101 are thus arranged in an electrical circuit, which is generally referred to as a flip-flop circuit, or trigger circuit commonly known as an Eccles-Jordan circuit, this circuit being modified in the manner to be described hereinafter to provide proper operation in response to the negative control pulses 94 supplied from the pulse shaping circuit.

The control pulses from the pulse shaping circuit are supplied over conductor 102 and through capacitors 103 and 104 to the suppressor electrodes of the devices 100 and 101, respectively. The suppressor electrodes of these devices are respectively connected to ground through the resistors 105 and 106. The anode of device 100 is connected through an anode load resistor 107 to the B+ supply and the anode of device 101 is connected through an anode load resistor 108 to the B+ supply. Screen dropping resistors 109 and 110 are provided between the B+ supply and the screen electrode devices of 100 and 101, respectively. The anodes of devices 100 and 101 are cross-connected to the control electrode of the other device through the networks 111 and 112. Thus the anode of device 100 is connected through network 111 to the control electrode of device 101. Also, the anode of the device 101 is connected through network 112 to the control electrode of the device 100. The control electrodes of devices 100 and 101 are connected respectively through resistors 113 and 114 to the negative terminal of a battery 115, the positive terminal of battery 115 being connected to the ground. The control electrodes of devices 100 and 101 are also connected respectively to ground through resistors 116 and 117.

In considering the operation of the sensing circuit 37 in response to negative control pulses from the pulse shaping circuit 36, it will be understood that when one of the devices 100, 101 is conducting it will provide sufficient bias voltage to hold the other device beyond cutoff. Thus, assuming that device 100 is in a conductive state, the flow of current through the anode load impedance 107 associated therewith produces a sufficient voltage drop through the bleeder network comprising the resistive branch of the network 111, the resistor 114 and the battery 115 to hold the device 101 in a non-conductive state. In this connection it will be understood that the values of resistor 107, the resistive branch of network 111, and resistor 114 are chosen so that correct negative bias potential appears at the control electrode device 101 when the device 100 is in a conductive state. If, now, it is assumed that a negative control pulse is supplied to the suppressor electrode of device 101 through capacitor 103, the device 101 is abruptly switched to a non-conductive state. This causes a rise in potential at the anode of device 100 and a corresponding rise in potential at the control electrode of device 101, so that the device 100 conducts. When the device 101 conducts, the drop through its anode load resistor 108 produces a negative potential which biases off the control electrode of device 100 through the network 112 and the resistor 113. The device 100 is thus switched from a conductive to a non-conductive state in response to a first control pulse from the pulse shaping circuit 36. At the same time the device 101 is switched from a non-conductive to a conductive state.

The next succeeding control pulse from the pulse shaping circuit is coupled to the suppressor electrode of device 101 through the capacitor 104 so as to switch the device 101 abruptly from a conductive to a non-conductive state, the device 100 at the same time being placed in its initial conductive condition. Successive negative control pulses applied to the suppressor electrodes of the devices 100 and 101 operate to switch the devices abruptly from a conductive to a non-conductive state and vice versa. It is thus evident that the potentials which appear at the control electrodes of the devices 100 and 101 are of substantially uniform magnitude between pulses and abruptly switch from one value to the other in response to the control pulses from the pulse shaping circuit. Accordingly, the control electrode potentials of devices 100 and 101 may be used to control the reversible driving means 20 shown in Fig. 1. Thus, the control electrode potential of device 100 is connected through the conductor 118 to the reversible driving means 20 and the control electrode potential of device 101 is similarly connected through the conductor 119.

In Fig. 9 there is illustrated a reversible driving apparatus suitable for moving the tuning slug of the receiver under test in the desired directions. As shown, the reversible driving means comprises a pair of electron discharge devices 120 and 121. The control electrode of device 120 is connected to the sensing circuit 37 through an isolating resistor 122 and the conductor 119. Likewise the control electrode of device 121 is connected to the sensing circuit through an isolating resistor 123 and the conductor 118. To drive the tuning slug in the required direction, there is provided a reversible D. C. motor having an armature 125 and a pair of field windings 126 and 127. Energization of the armature 125 is controlled by the counter circuit 38 and will be described in detail in connection therewith. The flow of current through the windings 126 and 127 is controlled by means of the devices 120 and 121 so as to control the direction of rotation of the armature 125 and hence the direction of rotation of the driving member 25 which is used to vary the tuning of the resonant circuit. Thus, the field winding 126 is connected from the anode of device 120 to the B+ supply and the winding 127 is connected from the anode of device 121 to the B+ supply.

The devices 120 and 121 are controlled by the potentials appearing at the control electrodes of the sensing circuit control devices. Thus, considering the above-described situation wherein the device 100 of the sensing circuit is in a conductive state and the device 101 is in a non-conductive state, the control electrode of device 100 is at a relatively high positive potential so that the device 121 of the reversible driving means is also placed in a conductive state and current flows through the winding 127 so as to produce rotation of the armature 125 in a given direction. When a control pulse appears in the output of the pulse shaping circuit in response to passage of the resonant circuit through the maximum tuning point, the control devices of the sensing circuit are abruptly switched from a conductive to a non-conductive state and correspondingly the device 121 is rendered non-conductive and the device 120 is placed in a conductive state. With the device 120 conducting, current flows through the field winding 126 and causes rotation of the armature in the opposite direction. It is thus evident that successive control pulses from the pulse shaping circuit 36 operate to switch the current flow from one field winding to the other so that the armature 125 is reversed in response thereto.

Figure 10:
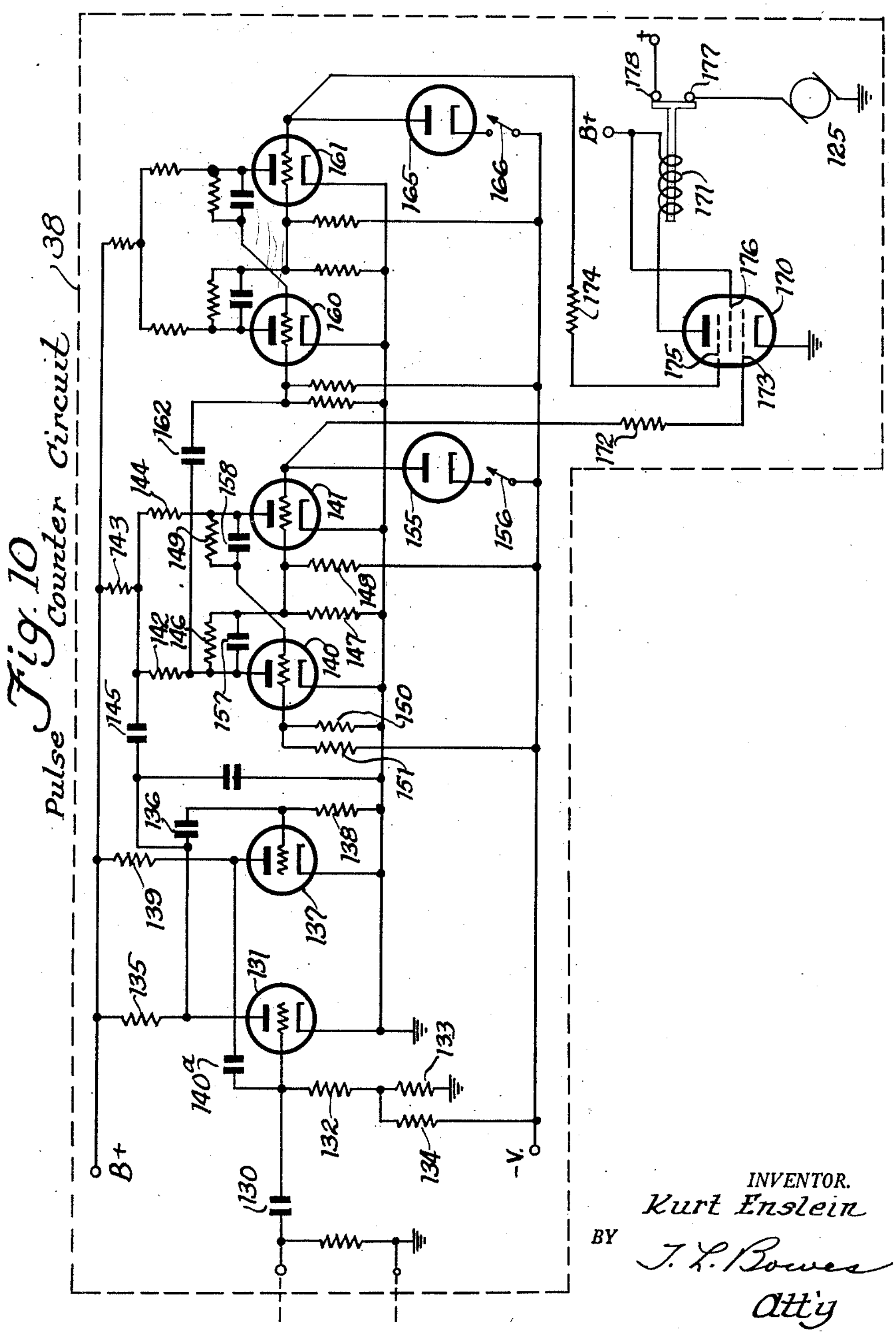

In order that the alignment of the resonant circuit may be accomplished in a minimum amount of time, the number of reversals of movement of the tuning slug is limited by means of the electronic counter circuit shown in Fig. 10. Thus, referring to Fig. 10, positive control pulses from the phase inverter 88 of the pulse shaping circuit 36 are supplied through a capacitor 130 to the control electrode of an electron discharge device 131. The control electrode of device 131 is connected through resistors 132 and 133 to ground potential, the junction point of resistors 132 and 133 being connected through a resistor 134 to a negative source of unidirectional potential. The anode of device 131 is connected through an anode load resistor 135 to the B+ supply and is also connected through a capacitor 136 to the control electrode of an electron discharge device 137. The control electrode of device 137 is connected to ground through a resistor 138. The anode of device 137 is connected through a load resistor 139 to the B+ supply and is further connected through a capacitor 140a to the control electrode of device 131.

The devices 131 and 137 operate as a multivibrator which is normally held inoperative by means of the bias network including resistors 133 and 134. However, positive pulses which are supplied to the pulse counter circuit 38 from the phase inverter tube 88 of the pulse shaping circuit 36 operate to trigger the multivibrator thus initiating one complete cycle of operation thereof. Thus, considering the application of a positive pulse through the capacitor 130 to the control electrode of device 131, the device 131 is caused to conduct maximum anode current, the corresponding drop in voltage across the anode load resistor 135 being coupled to the control electrode of device 137 so as to render that device non-conductive. When the charge on the coupling capacitor 136 is drained off through the associated grid leak resistor 138, the device 137 again conducts and the devices are switched abruptly to their initial position with the device 131 again in a non-conductive state. The multivibrator comprising devices 131 and 137 thus operates to provide at the anode of device 131 a negative-going square wave, the leading edge of which coincides in time with the output pulses from the pulse shaping circuit.

The output of the multivibrator which includes tubes 131 and 137 is coupled to a first trigger circuit which includes a pair of electron discharge devices 140 and 141. The anode of device 140 is connected through a first load resistor 142 and a second load resistor 143 to the B+ supply. Likewise the anode of device 141 is connected through a resistor 144 and the resistor 143 to the B+ supply. To connect the multivibrator to the trigger circuit 140 and 141, there is provided a capacitor 145 which is connected from the anode of device 131 to the junction of resistors 142, 143 and 144. The first trigger circuit including devices 140 and 141 is of the general type referred to as a flip-flop circuit, in which the electron discharge devices are arranged to be switched abruptly from a conductive to a non-conductive state, or vice versa, in response to control pulses of a given polarity. However, unlike the multivibrator 131 and 137 previously described, the devices 140 and 141 of the first trigger circuit remain in the condition to which they are switched until a succeeding control pulse is supplied to the circuit. To accomplish this, the devices are provided with interconnecting bleeder networks from the anode of one device to the control electrode of the other device. Thus, the device 140 is connected through a resistor 146 to the control electrode of device 141 and thence to ground through the resistor 147. The control electrode of device 141 is also connected through a resistor 148 to a negative source of potential. Likewise, the anode device of 141 is connected through a resistor 149 to the control electrode of device 140 and thence through a resistor 150 to ground. The control electrode of device 140 is also connected through a resistor 151 to the negative source of potential. The values of the resistors included in the bleeder networks connected between the anode of one device and the control electrode of the other device are so chosen that conduction of one device establishes a potential at the control electrode of the other device sufficient to bias the other device beyond cutoff. Thus, assuming that the device 140 is normally conducting, there is a flow of anode current through the resistors 142 and 143 so that the potential at the anode of device 140 has a relatively low value. The value of resistors 146, 147 and 148 are so chosen that the control electrode potential of device 141 is sufficiently negative to bias that device beyond cutoff. To facilitate an abrupt switching action, there is provided across the resistor 146 a capacitor 157 and across the resistor 149 a capacitor 158. The capacitors 157 and 158 operate as a high frequency by-pass so that the high frequency components which occur during the switching operations are conveyed directly to the control electrode of the opposite device.

In considering the flip-flop action of the trigger circuit, including devices 140 and 141 when negative pulses are supplied to the trigger circuit from the previous multivibrator, it should first be mentioned that the negative square wave from the output circuit of the multivibrator is differentiated in the circuit including capacitor 145 and the resistor 143, so as to provide a sharp negative pulse which coincides with the leading edge of the square wave produced by the multivibrator and hence corresponds in time to the leading edge of the output pulse supplied to the multivibrator from the pulse shaping circuit. In this connection it will be remembered that the leading edge of the pulse from the pulse shaping circuit corresponds approximately in time with the passage of tuning of the resonant circuit through the maximum response point. A negative pulse corresponding to the leading edge of the multivibrator output wave is connected to both anode circuits of the devices 140 and 141 and through the bleeder networks associated therewith to the control electrodes of the devices. This negative pulse which is supplied to the trigger circuit operates to cut off the particular one of the devices 140 and 141 which is conducting at that particular time and hence operates to switch the devices abruptly from a conductive to a non-conductive state and vice versa.

In order to render one of the devices 140 and 141 non-conductive so that the counter circuit may be re-set, there is provided a diode rectifier device 155, the anode of which is connected to the control electrode of device 141 and the cathode of which is connected through a switch 156 to the negative source of potential. With the switch 156 closed, the diode 155 is of the proper polarity to conduct and causes the control electrode of device 141 to be held at the negative supply potential. Thus, closure of the switch 156 and subsequent opening thereof insures that the device 141 is normally non-conducting and that the first control pulse indicative of passage of the resonant circuit throughout the maximum tuning point will switch the devices 140 and 141 in a predetermined sequence.

In order to count a plurality of control pulses from the pulse shaping circuit and hence to provide for a plurality of reversals in direction of the movement of the tuning slug, there is provided a second trigger circuit, including a pair of electron discharge devices 160 and 161. The devices 160 and 161 are controlled from the first trigger circuit described above and the second trigger circuit is substantially identical in construction thereto. However, control pulses from the first trigger circuit are connected to the control electrode of the device 160 instead of being connected to the anode circuits of both devices as in the first trigger circuit. Thus, the anode of device 140 is connected through a capacitor 162 to the control electrode of device 160. The capacitor 162 and the associated resistance of the input circuit of device 160 are so chosen that the output wave from the first trigger circuit is differentiated as it is applied to the second trigger circuit.

The second trigger circuit, including devices 160 and 161, is also provided with means for insuring that a particular one of the devices is normally non-conductive. Thus, there is provided a diode rectifier device 165, the anode of which is connected to the control electrode of device 161 and the cathode of which is connected through a switch 166 to the negative source of supply. Closure of the switch of 166 places the control electrode of device 161 at the negative supply potential, thus insuring that the device 161 is normally non-conductive. In this connection, it will be understood that the switches 156 and 166 are opened before the counter circuit is to be used so as to allow the above-described switching action to occur in both the first and second trigger circuits.

In order to control the reversible motor means 20 in accordance with a predetermined number of pulses from the shaping circuit 36, there is provided a control device 170 in the anode circuit of which there is connected a relay winding 171. The control electrode of the normally non-conducting device 141 of the first trigger circuit is connected through an isolating resistor 172 to the first control electrode 173 of the device 170. Likewise, the control electrode of the normally non-conducting device 161 of the second trigger circuit is connected through an isolating resistor 174 to the suppressor electrode 175 of the device 170. The screen electrode 176 of device 170 is connected to the B+ supply. Inasmuch as the control electrodes 173 and 175 of the device 170 are directly connected to the control electrodes of the normally non-conducting devices 141 and 161, the device 170 is normally held in a non-conductive state with the contacts 177 and 178 associated with the relay coil 171 normally closed. When both the devices 141 and 161 are in a conductive state, both the control electrodes 173 and 175 are at a positive potential with respect to ground and hence the device 170 permits a flow of current through the relay coil 171 to open the contacts 177 and 178. The contacts 177 and 178 are included in the armature circuit of the driving motor. Thus, the armature 125 of the reversible driving motor is connected from ground to the contact 177 and the contact 178 is connected to a positive source of unidirectional potential suitable for energization of the armature 125.

Considering now the operation of the above-described trigger circuits in counting a predetermined number of motor reversals before de-energizing the armature thereof, it will be remembered that the devices 141 and 161 of the respective trigger circuits are conditioned for the counting operation by placing these devices in a normally non-conductive state by momentary closure of the switches 156 and 166. The first negative pulse from the multivibrator comprising the devices 131 and 137, which corresponds to the first pulse from the shaping circuit 36, switches the devices 140 and 141 so that the device 140 is non-conductive and the device 141 is in a conductive state. Switching of the device 141 to a conductive state causes the potential at the control electrode 173 of the device 170 to be at ground potential. However, the second control electrode 175 of device 170 is still at a large negative potential so that the device 170 does not conduct and hence the relay contacts remain closed.

The second control pulse from the multivibrator switches the devices 140 and 141 back to their original position and in so doing the device 140 is changed from a non-conductive to a conductive state. When the device 140 conducts due to the second control pulse supplied to the first trigger circuit, there is produced in the anode circuit of device 140 a negative pulse which is applied through the capacitor 162 to the device 160 and operates to switch the second trigger circuit. Simultaneously with the switching of the first trigger circuit back to its initial position the second trigger circuit is switched due to the above-mentioned connection of the device 140 to the device 160. Thus, the second control pulse causes the device 160 to be rendered non-conductive and the device 161 to be rendered conductive. With the device 161 conductive, the control electrode 175 of device 170 is at ground potential. However, simultaneously with the switching of device 161 to a conductive condition, the device 141 is switched back to a non-conductive condition so that the control electrode 173 is at a large negative potential and the device 170 remains in a non-conductive state.

Upon the occurrence of a third negative control pulse from the multivibrator, which corresponds to a third reversal in the direction of travel in the tuning slug, the first trigger circuit is switched so that the device 140 is in a non-conductive state and the device 141 is conductive. Inasmuch as both the devices 141 and 161 are now conducting, the device 170 is rendered conductive and the relay coil opens the relay contacts 177 and 178 so that the armature circuit of the driving motor is deenergized. It is thus evident that the pulse counter circuit 38 responds to the third control pulse supplied thereto from the pulse shaping circuit and operates to de-energize the driving motor upon the occurrence of the third control pulse. In this connection, it will be remembered that control pulses from the pulse shaping circuit are also supplied to the sensing circuit which operates to reverse the direction of travel of the driving motor for each control pulse so that the tuning slug is reversed in direction three times before the driving motor is de-energized.

While there is illustrated a particular arrangement in which movement of the tuning slug is discontinued after three reversals in the direction of movement thereof, it will be obvious that a different number of reversals may be utilized. For example, if sufficient gain is provided in the discriminating amplifier and pulse shaping circuit the tuning slug may be stopped at the second reversal of the driving motor. On the other hand, more reversals may be desirable to increase the accuracy of tuning to the alignment signal.

While there has been described what is at present considered to be the preferred embodiment of the invention, it will be understood that various modifications may be made therein which are within the true spirit and scope of the invention as defined in the appended claims.

What is claimed as new and is desired to be secured by Letters Patent of the United States is:

1. The method of adjusting the tuning of a resonant circuit to a predetermined frequency which comprises the steps of, energizing said circuit at said predetermined frequency, varying the tuning of said resonant circuit in a predetermined direction, deriving a signal from said resonant circuit indicative of the passage of said resonant circuit through said predetermined frequency and reversing the direction of tuning of said resonant circuit in response to said signal.

2. The method of adjusting the tuning of a resonant circuit to a predetermined frequency which comprises the steps of, energizing said circuit at said predetermined frequency, varying the tuning of said resonant circuit in a predetermined direction, deriving a signal from said resonant circuit indicative of the passage of said resonant circuit through said predetermined frequency, reversing the direction of tuning of said resonant circuit in response to said signal, and stopping said tuning variation at the maximum response point of said resonant circuit.

3. The method of adjusting the tuning of a resonant circuit to a predetermined frequency which comprises the steps of energizing said circuit at said predetermined frequency, varying the resonant frequency of said circuit in a predetermined direction, deriving a signal from said resonant circuit in response to passage of the resonant frequency of said circuit through said predetermined frequency, and reversing the direction of frequency variation of said circuit in response to said signal.

4. The method of adjusting the tuning of a resonant circuit to a predetermined frequency which comprises the steps of, energizing said resonant circuit at said predetermined frequency, varying the tuning of said resonant circuit in a predetermined direction, deriving a signal from said resonant circuit proportional to the instantaneous frequency thereof, differentiating said signal to obtain control pulses indicative of the passage of said resonant circuit through said predetermined frequency, successively reversing the direction of tuning of said resonant circuit in response to said control pulses, and stopping said tuning variation at the maximum response point of said resonant circuit.

5. Apparatus for automatically tuning a resonant circuit to a predetermined frequency, comprising means for energizing said resonant circuit at said predetermined frequency, tuning means for varying the tuning of said circuit, reversible motor means for moving said tuning means, means responsive to passage of said tuning means through the peak resonance point of said resonant circuit for effecting reversal of said motor means, and means for stopping said tuning means at said peak resonance point.

6. Apparatus for automatically tuning a resonant circuit to a predetermined frequency, comprising means for energizing said resonant circuit at said predetermined frequency, reversible motor means, tuning means driven by said motor means for varying the tuning of said circuit, means responsive to passage of said tuning means through the peak resonance point of said resonant circuit for effecting reversal of said motor means, and means responsive to a predetermined number of passages through said peak resonance point for stopping said tuning means.

7. Apparatus for automatically aligning tunable circuits, comprising means for energizing the tunable circuit at a predetermined frequency, tuning means for varying the tuning of said resonant circuit, reversible motor means for driving said tuning means, means for reversing said motor means when said tuning means has passed through the peak resonance point of said resonant circuit, and means for stopping said tuning means at said peak resonance point.

8. Apparatus for automatically aligning tunable circuits, comprising means for energizing the tunable circuit at a predetermined frequency reversible motor means, tuning means driven by said motor means for varying the tuning of said circuit between predetermined limits on opposite sides of the point of maximum response of the tunable circuit, means for reversing said motor means when said tuning means has passed through said point of maximum response, and means responsive to a predetermined number of passages through said point of maximum response for deenergizing said motor means.

9. Apparatus for automatically aligning tunable circuits, comprising means for energizing the tunable circuit at a predetermined frequency, reversible motor means, tuning means driven by said motor means for varying the tuning of said circuit between predetermined limits on opposite sides of the point of maximum response, means for deriving from said circuit a signal indicative of the passage of said tuning means through said maximum response point, and means responsive to said signal for effecting reversal of said motor means.

10. Apparatus for automatically aligning tunable circuits comprising means for energizing the tunable circuit at a predetermined frequency, reversible motor means, tuning means driven by said motor means for varying the tuning of said circuit between predetermined limits on opposite sides of the point of maximum response, means for deriving from said circuit a signal indicative of the passage of said tuning means through said maximum response point, means responsive to said signal for effecting reversal of said motor means, and means for stopping said tuning means at said peak resonance point.

11. Apparatus for automatically aligning tunable circuits, comprising means for energizing the tunable circuit at a predetermined frequency, reversible motor means, tuning means driven by said motor means for varying the resonant frequency of said circuit, means for deriving a signal from said circuit proportional to the instantaneous frequency thereof, means for differentiating said signal to obtain a control pulse indicative of the passage of said circuit through said predetermined frequency, means for reversing said motor means in response to said control pulse, and means for stopping said tuning means at the maximum response point of said tunable circuit.

12. Apparatus for automatically aligning tunable circuits, comprising means for energizing the tunable circuit at a predetermined frequency, reversible motor means, tuning means driven by said motor means for varying the resonant frequency of said circuit, means for deriving a signal from said circuit proportional to the instantaneous frequency thereof, means for differentiating said signal to obtain a control pulse indicative of the passage of said circuit through said predetermined frequency, means for reversing said motor means in response to said control pulse, and pulse counter means responsive to said control pulses for stopping said tuning means at the maximum response point of said tunable circuit.

13. Apparatus for automatically aligning tunable circuits, comprising means for energizing the tunable circuit at a predetermined frequency, reversible motor means, tuning means driven by said motor means for varying the resonant frequency of said circuit, means for deriving a signal from said circuit proportional to the instantaneous frequency thereof, means for differentiating said signal to obtain a control pulse indicative of the passage of said circuit through said predetermined frequency, means for reversing said motor means in response to said control pulse, and pulse counter means responsive to said control pulses for deenergizing said motor means after a predetermined number of reversals in the direction thereof.

14. Apparatus for automatically tuning a resonant circuit to a predetermined frequency, comprising means for supplying oscillations at said predetermined frequency to the resonant circuit, means for varying the tuning of said resonant circuit in a predetermined direction, means for deriving a signal from said resonant circuit proportional to the instantaneous frequency thereof, means for differentiating said signal to obtain control pulses indicative of the passage of said resonant circuit through said predetermined frequency, means for successively reversing the direction of tuning of said resonant circuit in response to said control pulses, and pulse counter means for stopping said tuning variation at the maximum response point of said resonant circuit.

15. Apparatus for automatically aligning tunable circuits, comprising means for energizing the tunable circuit at a predetermined frequency, reversible motor means, tuning means driven by said motor means for varying the resonant frequency of said circuit, means for deriving a signal from said circuit proportional to the instantaneous frequency thereof, means for differentiating said signal to provide a pulse of one polarity followed by a pulse of the opposite polarity, said oppositely polarized pulses occurring on opposite sides of the peak response point of said tunable circuit, means for selecting only said pulse of opposite polarity, means for increasing the slope of the leading edge of said selected pulse, and means for reversing said motor means in response to said selected pulse of increased slope.

16. Apparatus for automatically aligning tunable circuits, comprising means for energizing the tunable circuit at a predetermined frequency, reversible motor means, tuning means driven by said motor means for varying the resonant frequency of said circuit, means for deriving a signal from said circuit proportional to the instantaneous frequency thereof, means for differentiating said signal to provide a pulse of one polarity followed by a pulse of the opposite polarity, said oppositely polarized pulses occurring on opposite sides of the peak response point of said tunable circuit, means for selecting only said pulse of opposite polarity, means for increasing the slope of the leading edge of said selected pulse, means for reversing said motor means in response to said selected pulse of increased slope, and pulse counter means responsive to said selected pulses of increased slope for de-energizing said motor means after a predetermined number of reversals in the direction thereof.

17. Apparatus for automatically tuning a resonant circuit to a predetermined frequency, comprising means for supplying oscillations at said predetermined frequency to the resonant circuit, means for varying the tuning of said resonant circuit in a predetermined direction, means for deriving a signal from said resonant circuit proportional to the instantaneous frequency thereof, means for differentiating said signal to provide a pulse of one polarity followed by a pulse of the opposite polarity, said oppositely polarized pulses occurring on opposite sides of the peak response point of said resonant circuit, means for selecting and shaping said pulses of opposite polarity to provide steep sloped control pulses, sensing means responsive only to said control pulses for successively reversing the direction of tuning of said resonant circuit, and pulse counter means responsive to said control pulses for stopping said tuning variation after a predetermined number of reversals of the direction of tuning thereof.

18. The method of adjusting the tuning of a resonant circuit to a predetermined frequency which comprises the steps of, energizing said resonant circuit at said predetermined frequency, varying the tuning of said resonant circuit in a predetermined direction, deriving a signal from said resonant circuit proportional to the instantaneous frequency thereof, differentiating said signal to provide a pulse of one polarity followed by a pulse of the opposite polarity, said oppositely polarized pulses occurring on opposite sides of the peak response point of said resonant circuit, selecting only said pulse of said opposite polarity, successively reversing the direction of tuning of said resonant circuit in response to said selected pulses, and stopping said tuning variation after a predetermined number of reversals in the direction thereof.

19. The method of adjusting the tuning of a resonant circuit to a predetermined frequency which comprises the steps of, energizing said resonant circuit at said predetermined frequency, varying the tuning of said resonant circuit in a predetermined direction, deriving a signal from said resonant circuit proportional to the instantaneous frequency thereof, differentiating said signal to provide a pulse of one polarity followed by a pulse of the opposite polarity, said oppositely polarized pulses occurring on opposite sides of the peak response point of said resonant circuit, selecting only said pulses of said opposite polarity, deriving from said selected pulses control pulses having leading edges which occur just slightly after the passage of said resonant circuit through the peak response point thereof, successively reversing the direction of tuning of said resonant circuit in response to said control pulses, and stopping said tuning variation after a predetermined number of reversals in the direction thereof.

KURT ENSLEIN.

REFERENCES CITED

The following references are of record in the file of this patent:

UNITED STATES PATENTS

| Number | Name | Date |
|---|---|---|
| 2,203,878 | Rosenberg | June 11, 1940 |
| 2,468,350 | Sunstein | Apr. 26, 1949 |